US007116195B2

(12) United States Patent
Vittorio

(10) Patent No.: US 7,116,195 B2
(45) Date of Patent: Oct. 3, 2006

(54) RECEIVING COIL FOR NUCLEAR MAGNETIC RESONANCE IMAGING APPARATUS FOR SPINAL COLUMN IMAGES

(75) Inventor: Viti Vittorio, Arenzano (IT)

(73) Assignee: Esaote S.p.A., Casale Monferrato (IT)

( * ) Notice: Subject to any disclaimer, the term of this patent is extended or adjusted under 35 U.S.C. 154(b) by 266 days.

(21) Appl. No.: 10/813,263

(22) Filed: Mar. 31, 2004

(65) Prior Publication Data

US 2005/0046530 A1    Mar. 3, 2005

(30) Foreign Application Priority Data

Mar. 31, 2003   (IT)   ............ SV2003A0012

(51) Int. Cl.
*H01F 7/00*   (2006.01)
(52) U.S. Cl. ........................ 335/216; 324/318
(58) Field of Classification Search ............... 335/216; 324/318–322; 600/419; 336/200
See application file for complete search history.

(56) References Cited

U.S. PATENT DOCUMENTS

| | | | | |
|---|---|---|---|---|
| 5,006,805 A | * | 4/1991 | Ingwersen | 324/322 |
| 5,197,474 A | * | 3/1993 | Englund et al. | 600/415 |
| 5,706,813 A | * | 1/1998 | Filler et al. | 600/422 |
| 6,118,274 A | * | 9/2000 | Roffmann et al. | 324/321 |
| 6,476,606 B1 | * | 11/2002 | Lee | 324/309 |
| 6,771,998 B1 | * | 8/2004 | Kirsch | 600/410 |
| 2002/0107441 A1 | * | 8/2002 | Kirsch | 600/410 |

FOREIGN PATENT DOCUMENTS

| | | |
|---|---|---|
| DE | 199 56 723 | 6/2001 |
| EP | 0 759 560 | 2/1997 |
| EP | 1 113 286 | 7/2001 |
| WO | 02/42791 | 5/2002 |

OTHER PUBLICATIONS

Copy of search report issued in a corresponding application.

* cited by examiner

*Primary Examiner*—Tuyen T Nguyen
(74) *Attorney, Agent, or Firm*—Buchanan Ingersoll & Rooney PC

(57) ABSTRACT

Receiving coil for nuclear magnetic resonance imaging apparatus for spinal column images, where the apparatus has a supporting bench of the patient and an element for generating a static magnetic field perpendicularly oriented with respect to the supporting bench of the patient. The receiving coil is provided with at least two conductors useful for the detection extending in the direction of the positioning of the longitudinal extension of the spinal column and in the supporting bench or in a bench parallel to the supporting bench of the patient and have a length that is enough to cover approximately the anatomic district of the spinal column or a part of interest thereof, the distance of the two conductors being in the order of magnitude of the average width of the spinal columns and the two conductors being connected in such a way to have a coherent flowing direction of current.

31 Claims, 7 Drawing Sheets

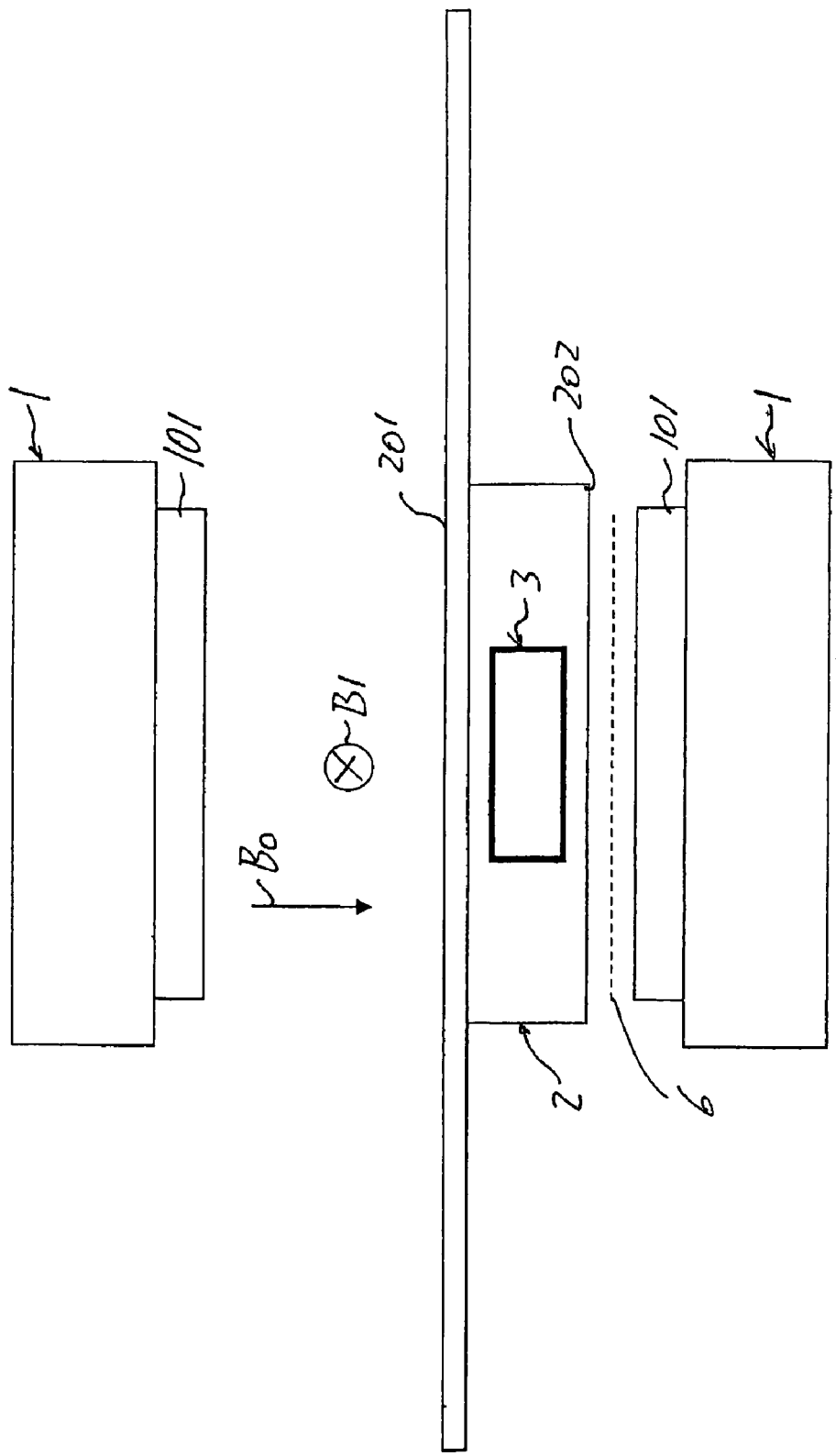

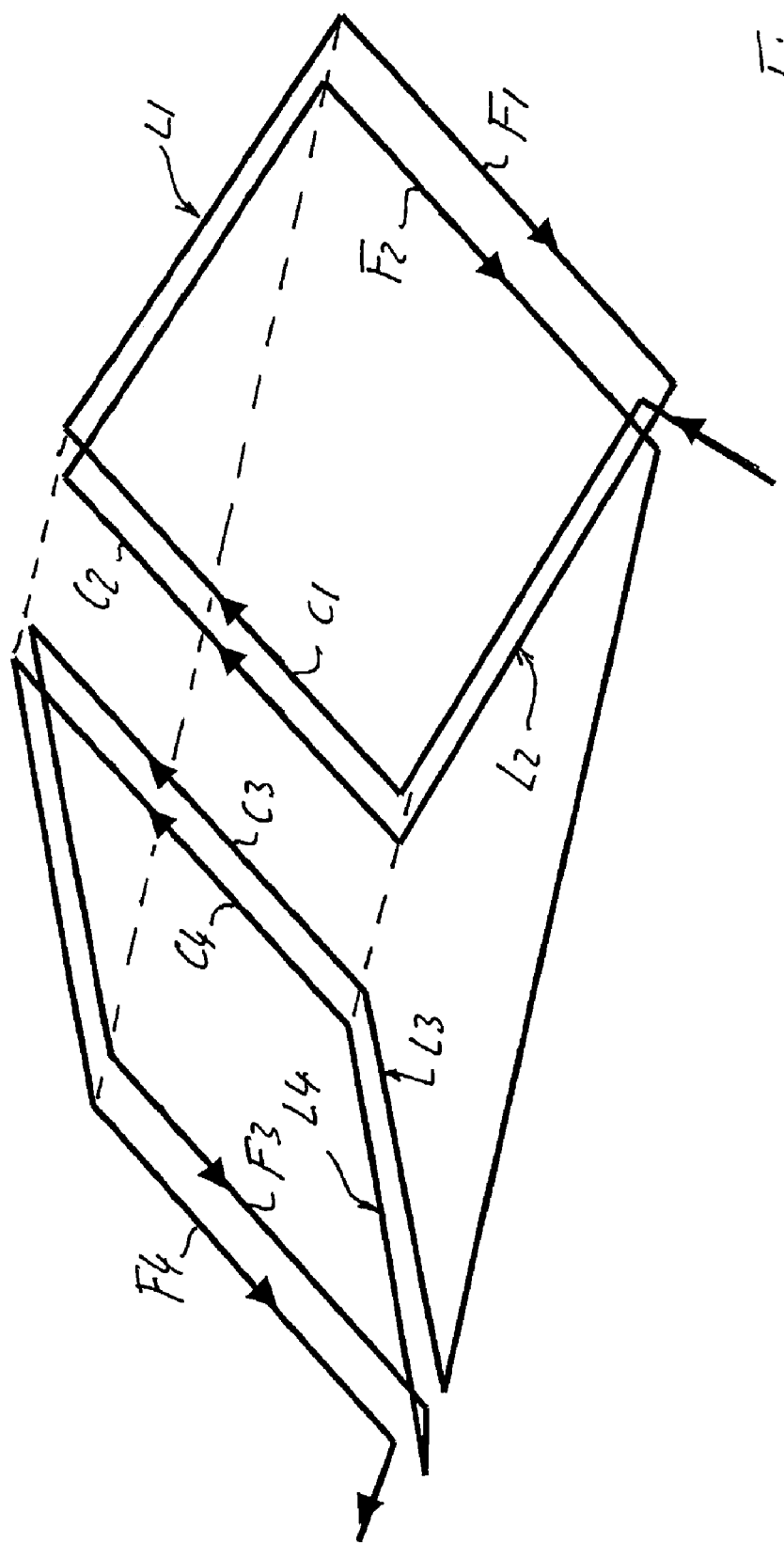

RECEIVING COIL FOR NUCLEAR MAGNETIC RESONANCE IMAGING APPARATUS FOR SPINAL COLUMN IMAGES

FIELD OF THE INVENTION

The present invention relates to nuclear magnetic resonance imaging apparatuses, and particularly to a receiving coil for a nuclear magnetic resonance imaging apparatus for spinal column images.

DESCRIPTION OF THE RELATED ART

Nuclear magnetic resonance imaging apparatus for spinal column images provided with a receiving coil are known. These apparatus use horizontal field flat coils in conjunction with a vertical static magnetic field, where the spinal column being imaged is arranged on an horizontal bench. This configuration of the arrangement between the receiving coil and the magnetic field of the nuclear magnetic resonance imaging apparatus is referred to as the "butterfly" configuration. However, because the spinal column has a long and narrow structure, this configuration also detects noise and artifact signals coming from body areas under examination which are devoid of interest.

Other types of receiving coils for nuclear magnetic resonance imaging of the spinal anatomic district are also known. However, these types of coils have complex conductor paths that make it difficult to plan or implement further turns or conductor portions to improve the coil sensitivity.

BACKGROUND OF THE INVENTION

The invention is based on the problem of manufacturing a receiving coil for a nuclear magnetic resonance imaging apparatus of spinal column images, as to obtain a constructive structure of the coil or at least of the conductors relevant for the detection of resonance signals which structure is best adapted to the geometric/morphologic features of the spinal column area, extremely simple as regards the path of the detecting conductors and/or turns and easily improvable as regards the sensitivity for example with the addition of further portions of detecting conductor or of detecting turns.

OBJECT AND SUMMARY

An embodiment of the invention achieves the above aims providing a receiving coil for use in a nuclear magnetic resonance imaging apparatus for spinal column images, wherein the apparatus has a supporting bench for the patient and means for generating a static magnetic field perpendicularly oriented with respect to the supporting bench of the patient. According to an embodiment of the invention, the receiving coil comprises at least two conductor portions useful for the detection extending in the positioning direction of the longitudinal extension of the spinal column and in the parallel bench or in a parallel bench with respect to the supporting bench of the patient and they have a length that is enough for covering approximately the anatomic district of the spinal column or a part of interest thereof, the distance of the two conductors being in the order of magnitude of the average width of the spinal columns and the said two conductors being connected in such a way to have a coherent flowing direction of current.

According to one embodiment of the invention, the receiving coil is composed of at least two rectangular turns, whose two conductors adapted to be arranged nearer the patient are the useful detecting conductors and the opposite conductors are the so called re-closing conductors or wires.

The coil according to this embodiment can subtend an envelope solid with a parallelepiped rectangular shape.

The advantages of the embodiment are that the coil is simple and cost effective to construct and it can be easily integrated with further turns in order to increase its sensitivity. Indeed, it's very easy to manufacture and to handle the rectangular turns. The simplicity of turns allows also to provide a modular construction allowing the progressive addition of turns to a coil having a base number of turns, namely the at least two turns constituting the two detecting wires.

If turns are added, the further rectangular turns are simply put beside the already existing turns from the outside, being possible to provide plugging electric connection system for the correct and prearranged connection of the further turns to the already existing ones.

Since spinal column images are generally imaged with the patient at least partially laid on an examination table, the simplicity of the depicted coil and the reduced dimensions allow to integrate the aforementioned receiving coil inside the examination table supporting the patient. In this embodiment, the side provided with the two detecting wires extends at or under the supporting bench of the apparatus, while the remaining part of the coil is embedded inside the examination table structure that generally has a fair thickness in order to allow driving of various positioning and adjusting devices to pass through it.

This configuration reduces the detection of artifacts and electromagnetic noise coming from patient areas that are not of interest, i.e. not from the spinal column anatomic district. Moreover, the arrangement of the useful detecting conductors as well as of the whole coil are geometrically adapted to the geometry or morphology of the spinal column. Moreover the overall arrangement of the coil conductors is extremely simplified and it allows an easy integration of the number of the useful detecting conductors for improving or varying the sensitivity.

However, the re-closing wires parallel to the useful detecting conductors of the resonance signals provided at a certain distance from the bench supporting the patient, can cause a contrast effect of the current induced in the detecting conductors on the field useful for image acquisition. This can cause a loss in sensitivity in the deep areas of the part under examination, i.e. the ones that are more distant from the conductors. Hence, the direction of the current flow in the re-closing wires is opposite to that of the detecting conductors and so the field generated by the re-closing wires is opposite to that of the detecting conductors.

In order to avoid such drawback, as a further improvement of the coil according to the present invention, in the plane defined by the two or more re-closing wires a conductor reflection shield is provided.

The shield, for example composed of copper, produces a reflection of the detecting conductors and of the re-closing wires, which reflected image has current flows, inside the reflections of the re-closing wires, that are opposed to the ones of the re-closing wires, eliminating or drastically reducing the contribution to the magnetic field of the re-closing wires.

The reflections made by the reflection conductor shield of the detecting conductors have a great distance from the location of the detecting wires and the contribution to the coil field in some points inside the area under examination is poor and it can be not considered.

Advantageously, the reflection shield can be composed of the RF shield of the transmitting coil which must be present and often it is in a position compatible with the one of the receiving coil. Therefore, the application of the reflection shield on the receiving coil does not require the presence of a further shield, but, in most cases, it consists in the simple use of means already provided in the nuclear magnetic resonance imaging apparatus.

BRIEF DESCRIPTION OF THE DRAWING FIGURES

The characteristics of the invention and the advantages derived there from will appear more clearly from the following description of a non limiting embodiment illustrated in the annexed drawings, in which.

FIG. 5 schematically shows a nuclear magnetic resonance imaging apparatus according to the present invention with a coil according to an embodiment of the present invention accommodated in the thickness of the examination table or of the bench supporting the patient.

Figure 6:
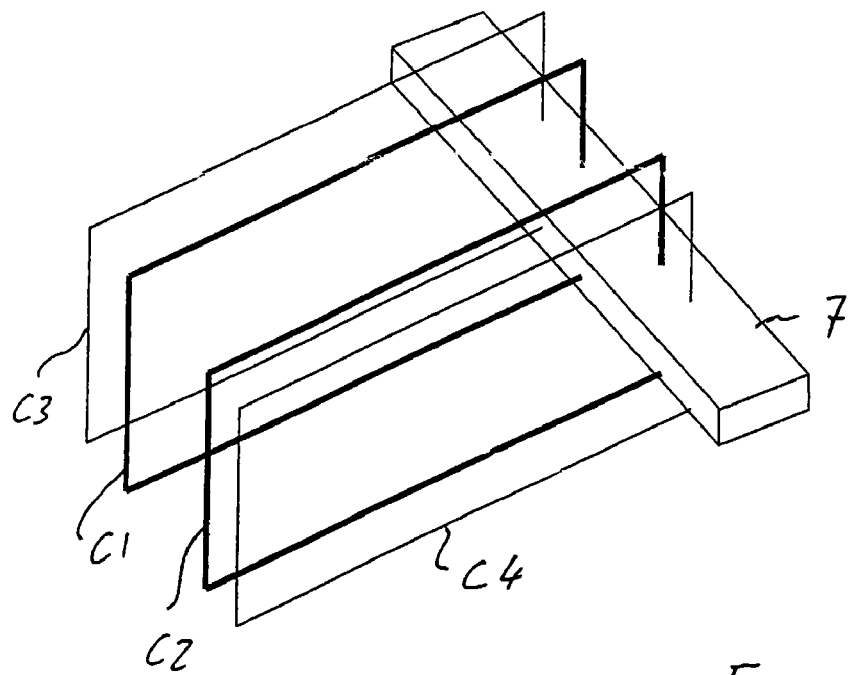

FIG. 6 shows schematically a coil according to an embodiment of the invention having several rectangular loops or turns.

FIG. 7 shows a first variant of a further embodiment of the receiving coil according to the invention in which the cross-section of the coil assembly according to a plane perpendicular to the main detection conductors and to the re-closing conductors, has a trapezoidal shape.

Figure 8:
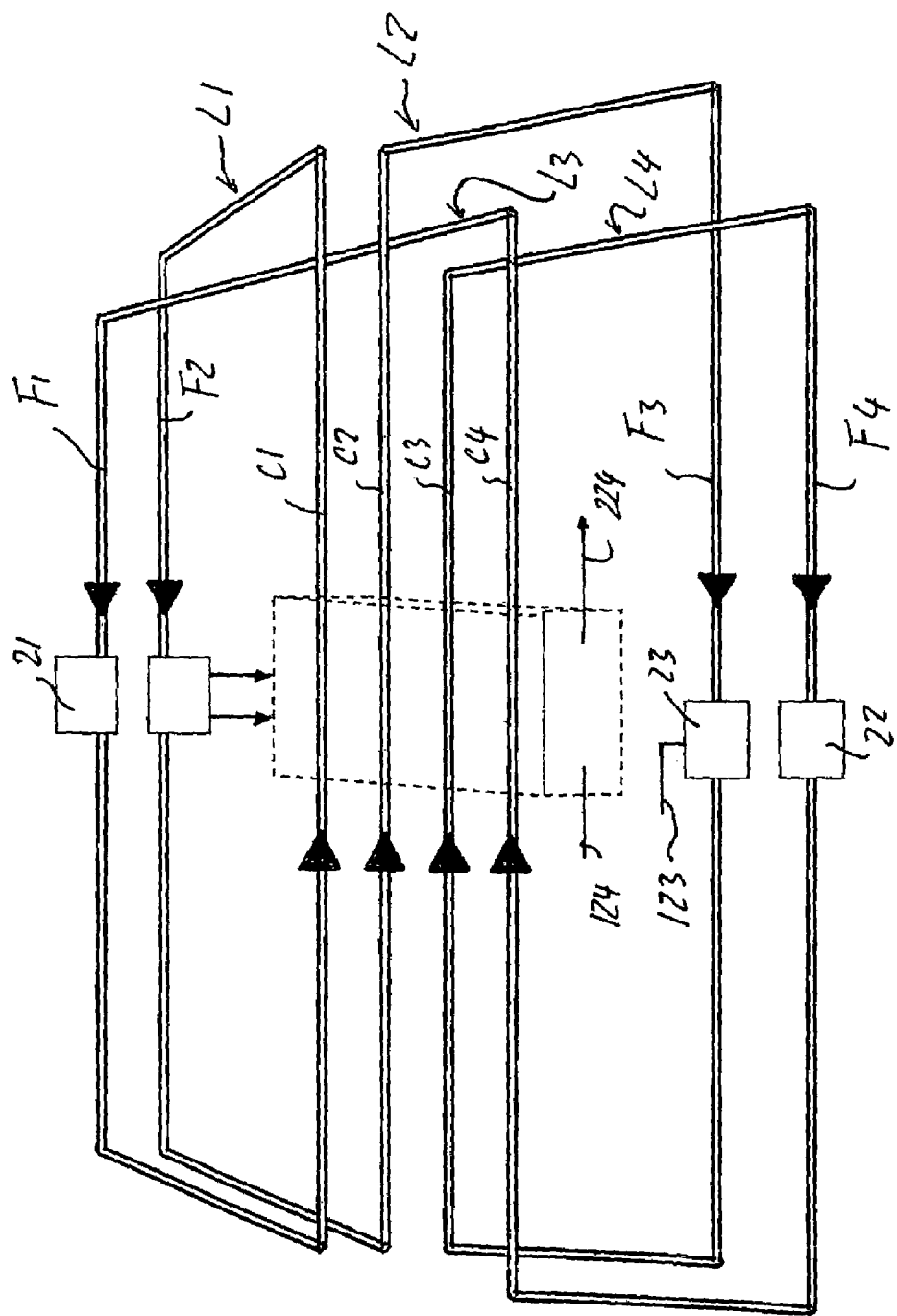
Figure 9:
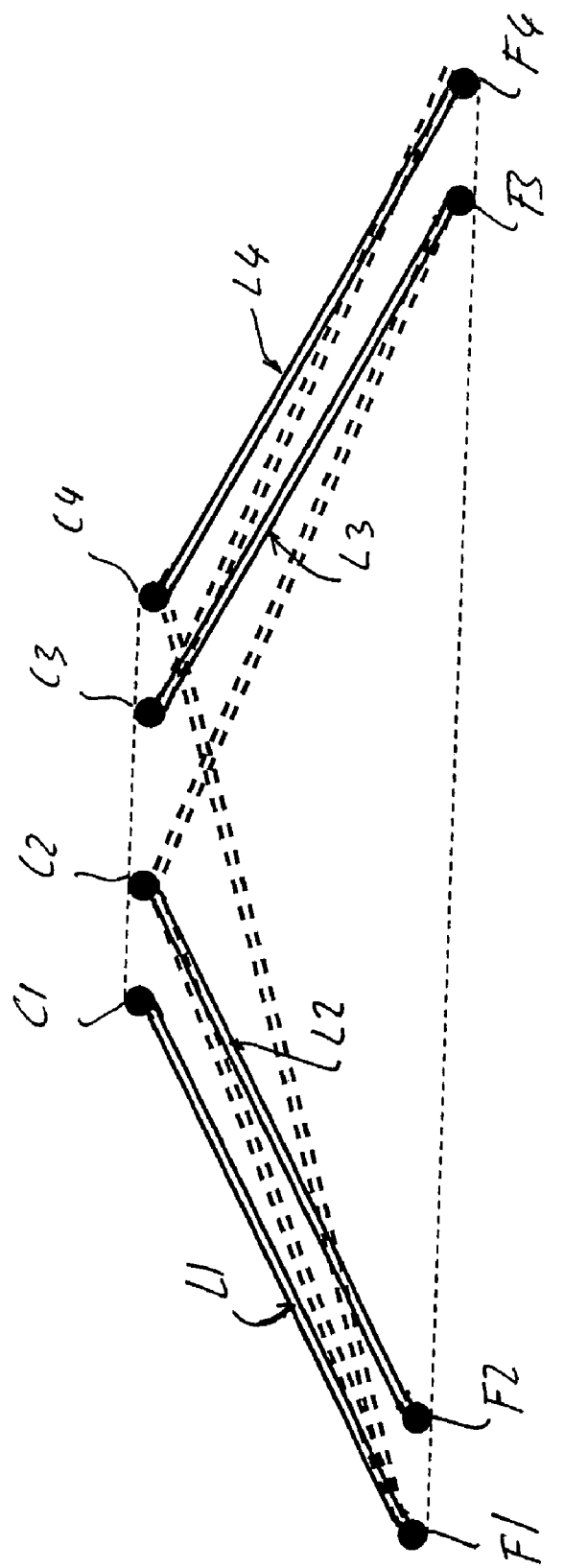

FIGS. 8 and 9 show a second variant of the embodiment according to FIG. 7.

DETAILED DESCRIPTION OF THE PREFERRED EMBODIMENT

In FIG. 5 an MRI apparatus is schematically shown which is particularly dedicated to imaging the spine or part thereof. The apparatus includes a magnetic structure 1 for generating a vertical static magnetic field B0 between two poles 101. The static magnetic field is indicated by the arrow B0. An examination table 2 for supporting the patient includes an horizontal supporting bench 201 for the patient that has to be laid supine on said bench.

The supporting bench 201 is supported by a bearing structure 202 that has a certain thickness and wherein a chamber can be obtained for accommodating a receiving coil 3. As it will result with reference to the following description, the receiving coil 3 is manufactured so as to generate a field indicated at B1 and oriented in the horizontal plane and having a perpendicular direction with respect to the static field B0. The field B1 that is perpendicular to the drawing sheet is indicated by the star B1 in FIG. 5. In the same figure, with 4 the RF shield is indicated which is usually provided in the apparatus with the above described description.

Obviously the nuclear magnetic resonance imaging apparatus has the common and known transmitting coils and gradient coils and the control and process electronics. These parts are not shown in detail since they are generally known and are not subject matter of the present invention.

Figure 1:
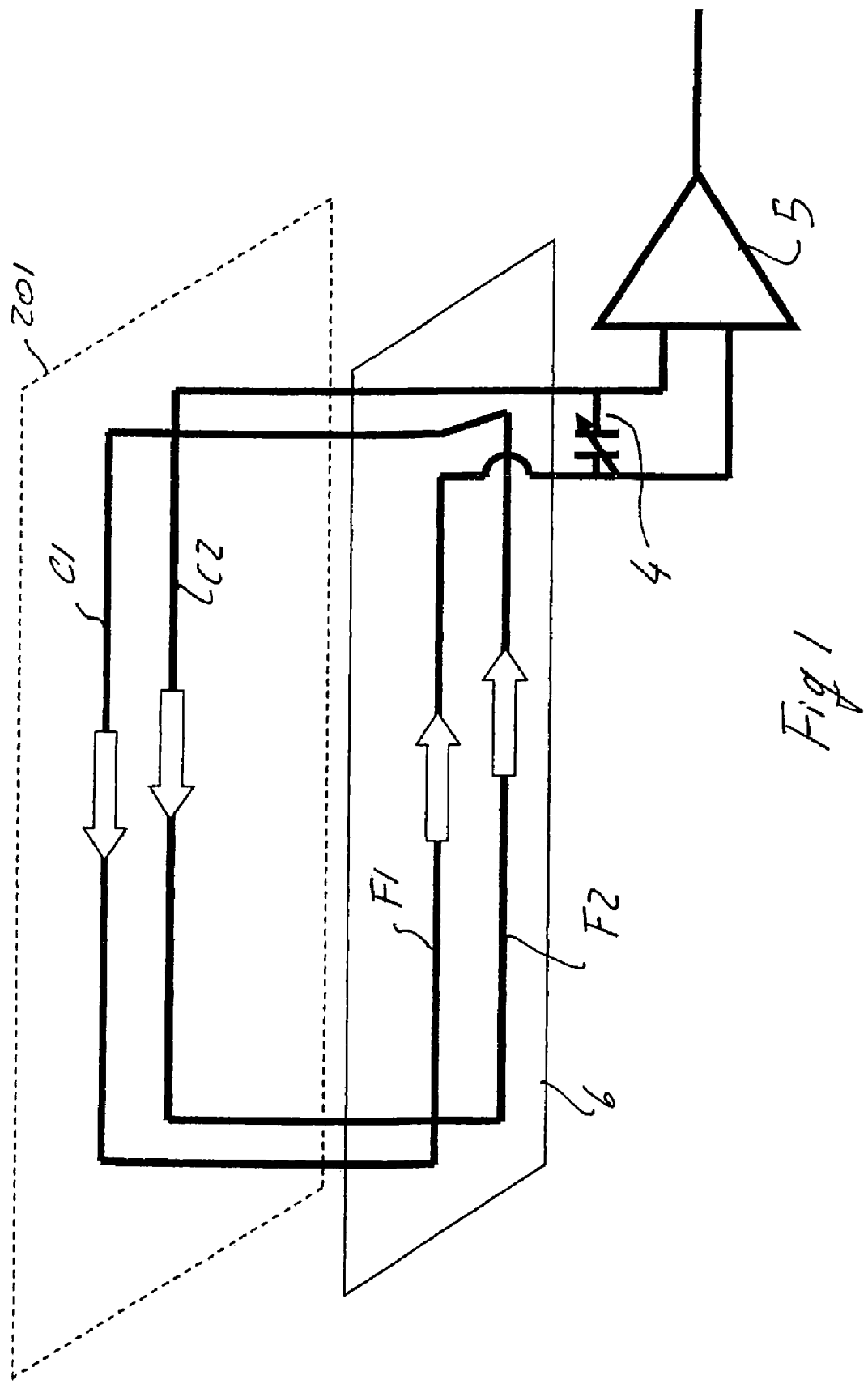
FIG. 1 is a schematic perspective view of a receiving coil according to an embodiment of the present invention.

FIG. 1 is a receiving coil 3 in accordance with an embodiment of the invention. The patient bench 201 is schematically indicated by broken lines. The coil 3 is composed of two rectangular turns each of them comprising a detecting conductor C1, C2 and a re-closing wire F1, F2. The two detecting conductors C1 and C2 are substantially rectilinear and parallel one with respect to each other and are accommodated in a bench that is directly adjacent and parallel with respect to the supporting bench of the patient. The arrows in FIG. 1 indicate the direction of the current flow induced by the signals detected in the conductors C1, C2, F1 and F2 of the coil 3.

The length and the distance of the detecting conductors and of the re-closing wires are selected in such a way that they have an arrangement adapted to the spinal column morphology. Particularly the coil is narrow and long. The distance between the detecting conductors C1, C2 and their length is selected based on the average length and width values of the spinal columns.

The two conductor turns can be mounted on a rigid frame, not shown, that corresponds to the final parallelepiped rectangle shape of the coil 3.

The coil 3 outputs are connected in parallel to a connection capacitor 4 and an amplifier 5. The amplifier 5 amplifies the received signals and then sends them to the remaining processing sequence for re-constructing the image.

Figure 2:
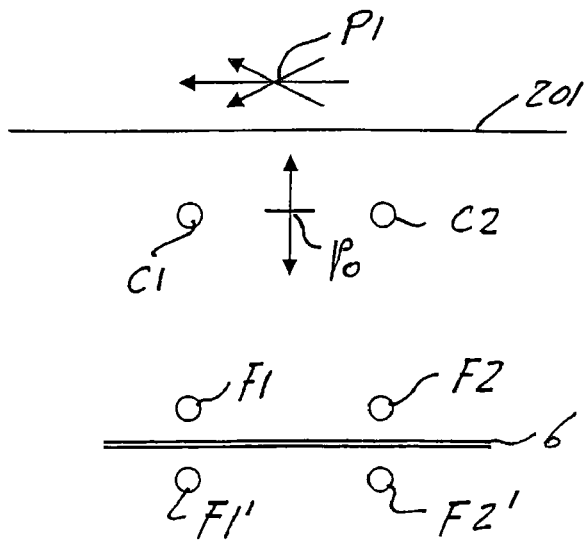
FIG. 2 shows a transverse section through the coil of FIG. 1, wherein the reflection shield and the reflection provided by this one of the receiving coil is further shown.

FIG. 2 shows a transverse section of the coil 3 wherein the detecting conductors C1 and C2 and the re-closing wires F1 and F2 can be seen.

Because the re-closing wires cause a field opposite of the field between the detecting conductors which can have repercussions on the acquired resonance signals used for the image, the coil 3 is associated to a shield of conductive material, particularly copper, that is provided on the horizontal bench in a position directly adjacent to the re-closing wires F1, F2. The shield 6, from the electrodynamic point of view, is a reflector device. Thus, a configuration of conductors or image wires is generated that help, in an effective way, to eliminate or reduce the contrast effects of the re-closing wires F1, F2 on the field useful for acquiring resonance signals.

Particularly, in a symmetric position with respect to the re-closing wires F1 and F2, the reflection contributes with image wires F1' and F2' with a current direction that is opposed to the one inside the re-closing wires F1, F2. Thus, the image wires eliminate in a great measure the effect of the re-closing wires F1, F2 on the field useful for image acquisition.

A reflected image C1' and C2' is generated also for the detecting conductors C1 and C2. However, the distance of this image from the detecting conductors C1 C2 region is such that the contribution generated by these one to the field at point P1, i.e. in the area of a certain depth in the body under examination, is poor and slight as the contribution of the re-closing wires F1 and F2 and of their reflections F1' and F2'.

An optimum condition is then obtained where the field between the two detecting conductors C1 and C2 at point P0 is null, while the field at point P1 is scarcely influenced by the reflections of the re-closing wires F1', F2' and by the reflections of the detecting conductors C1', C2', as already defined by the contributions caused by the re-closing wires F1, F2, by the reflections of the re-closing wires F1', F2' and by the reflections of the detecting conductors C1', C2'. As a result, the sensitivity of the coil is improved in the deep areas of the part under examination, i.e. the ones more distant from the detecting conductors.

The reflector shield can be a portion specifically dedicated to the receiving coil or can be composed by the RF shield of the transmitting coil that normally is present in a position that is compatible with the operation of the receiving coil.

Figure 3:
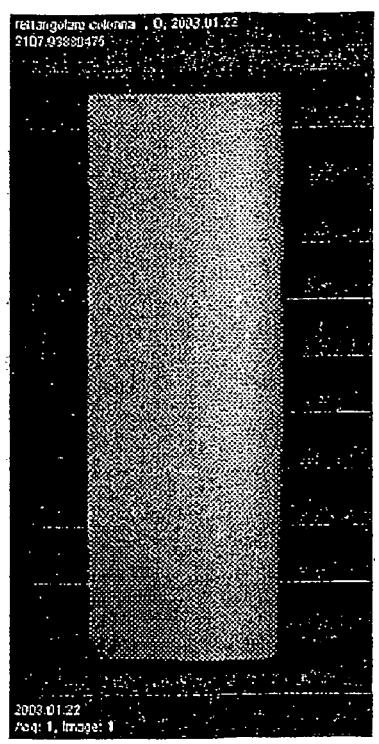
FIGS. 3 and 4 shows two NMR images obtained by the receiving coil according to the previous figures respectively in a sagittal section plane and in a transversal section plane, the images showing significantly the shape of the magnetic field in the coil according to the invention.
Figure 4:
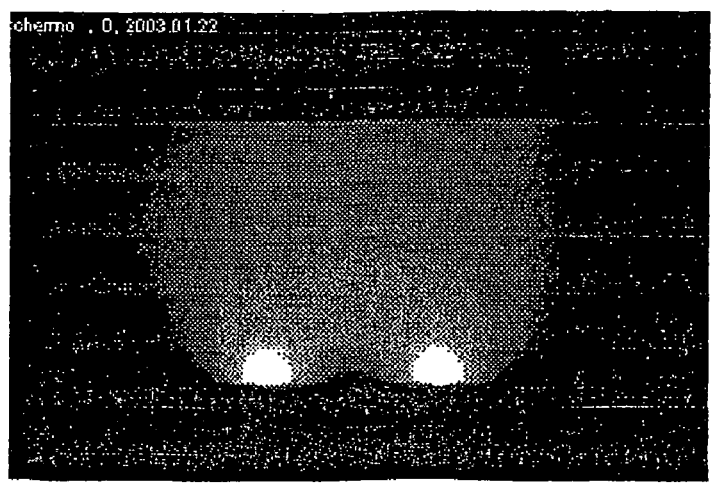

FIGS. 3 and 4 show by means of two NMR images the field generated by the detecting conductors C1 and C2 of the coil with two views, one is along a sagittal plane and the other in a transversal section plane as referred to the conductors C1 and C2, both with the presence of the reflection shield.

The coil structure can be composed of a frame of plastic material supporting the turns at angle regions, for example comprising two plaques at the end sides, around which the conductors are turned in order to form the detecting conductors and the re-closing wires.

As discussed above, the sensitivity of the coil can be easily enhanced by adding one or more rectangular turns in addition to the original ones. Due to the simplicity of the turn shape, this is not a problem and it is also possible to make an embodiment allowing the addition or removal of the added turns.

FIG. 6 schematically shows a coil provided with four turns. To the base structure comprising two detecting conductors C1 and C2 each of them belonging to one of two turns, further two detecting conductors C3, C4 of corresponding additional turns are associated. Each additional turn with the corresponding additional detecting conductor C3, C4 is put from the outside, besides one of the two main turns of the main detecting conductors C1 and C2, thus forming two sets of detecting conductors. The additional turns are aligned with the turns of the base coil and they can be also more than one for each base turn.

The turns can be connected with each other according to the diagram of FIG. 1 that is suitably enlarged if additional turns are present for example by means of a prefabricated connector 7 which has conducting tracks in conjunction with connection jumpers in order to correctly configure the electrical connection between the individual turns. As a result it is possible to configure the coil at ones pleasure with regard to the number of turns each time without realizing it ex novo.

FIGS. 7 to 9 show two variants of a further embodiment of the receiving coil according to the invention in which the different conductor turns of the coil are arranged in such a manner that the turns define a space which is not a rectangular parallelepipedon as disclosed above, but a different solid figure, preferably a parallelogram, trapezoidal or rhombus parallelepipedon.

Conductors C1 to C4 define one surface, while conductors F1 to F4 define the opposite surface of the parallelepipedon. The loops or turns are oriented as the side surfaces of the parallelpipedon parallel to the conductors C1 to C4 and to F1 to F4.

Generally said as far as the conductors C1 to C4 and the re-closing conductors F1 to F4 have such orientations as to determine a reflection plane of C1 to C4, any geometrical disposition of the planes defined by the loops or turns of conductors in the coil can be chosen in order to reduce the height of the coil. This is an important feature, since the coil has to be placed under the patient and reducing the height will help in maintaining a reduced gap between the opposite poles of a magnetic structure of a MRI apparatus according to the choice made here of providing the conductors C1 to C4 oriented in a transversal, particularly perpendicular direction with respect to the direction of the static magnetic field generated by the magnetic structure of the MRI apparatus. Reduced distance between the magnetic poles means that the overall size of the magnetic structure can be reduced with considerable advantages for the dimensions of the MRI scanner, for the weight of the MRI scanner and relatively to the costs of the MRI apparatus. Considering the possibility of housing the coil according to the invention in a slot or housing provided inside the structure of a patient supporting table or chair the reduced height of the coil would help in better matching the height of the patient bearing plate of the table or of the chair without the need of providing thicker parts of the plate at the slot for housing the coil in order to match the height thereof.

In the embodiment of FIG. 7, the disposition of the turns is such that the turns associated to the conductors C1 and C2 and the corresponding re-closing conductors F1, F2 on one side of a central plane of symmetry perpendicular to the plane defined by the said conductors and the conductors C3 and C4 and the corresponding re-closing conductors F3 and F4 on the other side of the plane of symmetry are oriented along diverging planes in the direction of the re-closing conductors F1 to F4 in such a way that the coil defines an ideal enveloping surface having the form of a regular trapezoidal parallelepipedon.

As it can be appreciated the disposition of the loops or turns spreads the dimensions of the space defined by the coil in a transversal direction to the orientation of the conductors C1 to C4 reducing the dimension in height. Thus the overall form and dimension of the coil better fits the dimension and the form of the structure of a patient supporting table or chair, particularly of the bearing plates of the table or chair.

A lot of different kind of configuring the turns can be chosen which are merely equivalent from the functional point of view.

FIGS. 8 and 9 show preferred embodiments in which a particular path of the loops or turns of the coils is chosen which allows constructive advantages to be obtained.

The conductors C1 to C4 are provided in a plane forming the smaller basis of the regular trapezoidal parallelepipedon as in the previous embodiment. The re-closing conductors are placed in a plane forming the bigger basis surface of the trapezoidal parallelepipedon and which is parallel to the smaller basis surface. In a different manner as the previous example the coil is completely closed on itself and no transverse conductors extending along the direction perpendicular to the conductors C1 and C4 at the bigger basis surface is needed. As it might be noted each conductor C1 to C4 is part of a loop section which forms with both ends only part, particularly only half of two different re-closing conductors F1 to F4, the other part or half being formed by the ends of the turn or loop sections which are associated to two other different conductors C1 to C4. So the loop section forming the conductor C1 forms with its ends part of the re-closing conductors F1 and F2 which other part is formed by the ends of the loop sections forming the conductors C2 and C4. The loop section forming the conductor C2 forms part of the re-closing conductors F2 and F3, which other parts is formed by the ends of the loop sections forming the conductors C1 and C3. The loop section forming the conductor C3 forms with its ends one part of the re-closing conductors F3 and F4 which other parts are formed by the ends of the loop sections forming the conductors C2 and C4 and the ends of the loop sections forming the conductor C4 forms part of the re-closing conductors F2 and F4, which other part is formed by the ends of the loop sections forming the conductors C1 and C3. The ends of each sections are mechanically separated and the different loop sections indicated by L1, L2, L3 and L4 are connected at their ends by means of electronic units carrying out different functions. Thus between the ends of the loop sections L1 and L4 forming the re-closing conductor F1 and between the ends of the loop sections L3 and L4 a detuning circuit such as a passive LC circuit is provided through which the said ends of the loop sections are electrically connected one with the other. Such circuits are indicated by boxes 20 and 21 in FIG. 8. The ends of the loops L2 and L3 are connected electrically to an active tuning circuit, comprising for example a varicap as the active tuning unit. Such tuning unit is indicated as a box 22 in FIG. 8.

Ends of the loop sections L1 and L4 forms the outputs 25 and 26 of the coil at which the output signals are extracted and separately fed to a differential preamplifier 24. Active tuning unit 22 and the preamplifier have both a power supply input respectively indicated with 122 and 124 and the preamplifier has a signal output 224 from which the signals received by the coil is fed to the further evaluation electronics of an MRI apparatus.

FIG. 9 illustrate a frontal view on the trapezoidal lateral surface of the coil from which the shape of a regular paralellpipedon can be better appreciated. The inclined parts of the loops which are at the rear are illustrated with discontinuous lines in order to differentiate them from the frontal ones. FIG. 9 refers to a view on the left hand side of the coil of FIG. 8 which is an upper perspective view of the coil.

Although the coil of FIGS. 7 to 9 has been illustrated in the form having four conductors C1 to C4, the same principle can be applied for a coil having only two conductors as in the embodiment of FIGS. 1 to 4 or in a coil having more than four conductors.

As illustrated in FIG. 8 the amplifier 24 can be best placed inside the coil assembly and housed in a electromagnetically shielded box for example made of a copper sheet.

Although only preferred embodiments are specifically illustrated and described herein, it will be appreciated that many modifications and variations of the present invention are possible in light of the above teachings and within the purview of the appended claims without departing from the spirit and intended scope of the invention.

What is claimed is:

1. A receiving coil for a nuclear magnetic resonance imaging apparatus for spinal column images, wherein the apparatus has a supporting bench for the patient and an element for generating a static magnetic field perpendicularly oriented to the supporting bench of the patient, the receiving coil comprising:
   at least two conductors which extend in a positioning direction of a longitudinal extension of the spinal column and in the supporting bench or in a bench parallel to the supporting bench of the patient and which have a length that is enough to cover approximately the anatomic district of the spinal column, the distance of the two conductors being on the order of magnitude of the average width of the spinal columns and the two conductors being connected in such a way to have a coherent flowing direction of current.

2. A coil according to claim 1, wherein the coil is formed by at least two rectangular turns, whose two conductors, that are to be positioned nearer the patient, are the useful detecting conductors and the opposite conductors are re-closing conductors or wires.

3. A coil according to claim 2, wherein the rectangular turns are arranged in order to subtend an envelope solid of a parallelepiped rectangular shape.

4. A coil according to claim 1, wherein the coil includes multiple detecting conductors put one beside the other, each of conductor being part of a rectangular turn.

5. A coil according to claim 4, further comprising:
   two main detecting conductors that are parallel and spaced one from the other, to each of these conductors are associated on the side opposite to the one oriented towards the associated main detecting conductor one or more additional detecting conductors that are parallel with respect to the main detecting conductors and are part of as many rectangular turns put from the outside besides the rectangular turns of the main detecting conductors.

6. A coil according to claim 5, the coil has a base structure composed of a pair of rectangular parallel turns put one beside the other connected in series one with the other by means of a terminal board provided with removable connection means and a plurality of further additional rectangular turns that can be connected in series one with the other and with the turns of the base structure by means of said terminal board in conjunction with connection jumpers, which additional rectangular turns can be mount in a removable way to the base structure.

7. A coil according to claim 1, further comprising: a reflection shield of conductive material, which shield is arranged directly below the re-closing wires that are parallel to the detecting conductors and it is oriented parallel to the plane subtended by the re-closing wires.

8. A coil according to claim 7, wherein the reflection shield is composed of a RF shield that is in common with a transmitting coil.

9. A coil according to claim 1, wherein the coil is provided in conjunction with a supporting bench for a patient, which bench has a bearing structure, in said bearing structure being provided a chamber for accommodating said receiving coil.

10. A coil according to claim 1, wherein the main detecting conductors are placed at narrower lateral distances one with respect to the other than the re-closing conductors.

11. A coil according to claim 10, wherein the main detecting conductors and the re-closing conductors are placed in such a way that with respect of a central plane parallel to the said conductors the main detecting conductors and the re-closing conductors on one side of the said central plane and the main detecting conductors and the re-closing conductors have the same lateral distance.

12. A coil according to claim 11, wherein the main detecting conductors have the same distance one from the other.

13. A coil according to claim 11, wherein the re-closing conductors have the same distance one from the other.

14. A coil according to claim 11, wherein the re-closing conductors on one side of the central plane and the re-closing conductors on the other side of the central plane have a greater distance one from the other than the main detecting conductors on one side of the central plane and the main detecting conductors on the other side of the central plane.

15. A coil according to claim 2, wherein the rectangular turns forming the main detecting conductors are arranged along parallel or diverging planes one from the other, which planes provide for re-closing conductors which are transversally not aligned with the main detecting conductors.

16. A coil according to claim 15, wherein the rectangular turns forming the main detecting conductors are oriented in such a way to subtend an envelope solid of a parallelepiped shape having a non rectangular cross-section along a plane transversal, particularly perpendicular to the said main detecting conductors.

17. A coil according to claim 15, wherein the rectangular turns forming the main detecting conductors are oriented in such a way to subtend an envelope solid of a parallelepiped shape having a cross-section along a plane transversal, particularly perpendicular to the said main detecting conductors which has the form of a trapezium, particularly a regular trapezium, or a parallelogram or a rhombus.

18. A coil according to claim 15, wherein the main detecting conductors are placed in a plane coinciding with the smaller basis of the trapezoidal parallelpipedon, while the re-closing conductors are placed on the plane forming the bigger basis of the trapezoidal parallelpipedon which is parallel to the said smaller basis.

19. A coil according to claim 15, wherein the main detecting conductors and the re-closing conductors are placed symmetrically with respect to a plane oriented parallel to the said conductors and perpendicular to the plane defined by the main conductors and or by the re-closing conductors and or both the planed defined by the said conductors.

20. A coil according to claim 19, wherein the turns are such that each turn forms entirely a main detecting conductor and a re-closing conductor, part of the said turns, particularly half the number of the said turns being oriented substantially parallel to the lateral surfaces of the enveloping parallelpipedon defined by the coil, which surfaces are parallel to both the associated main detecting conductor and corresponding re-closing conductor.

21. A coil according to claim 15, wherein the coil is closed on itself providing an endless conductor.

22. A coil according to claim 15, wherein the coil is made of at least two loop sections which a first loop section being mechanically separated at the two opposite ends form the corresponding end of the two opposite ends of the second loop sections the facing first ends of the said first and second loop sections forming the outputs of the coil which are fed to a differential amplifier, while the second facing ends of the said first and second loop sections are electrically connected by means of an active tuning unit.

23. A coil according to claim 22, wherein the coil is made of at least three successive loop sections each of the three sections having a first and a second end the first end of the first loop section forming the output of the coil together with the second end of the third loop section, while between the end of the second loop section associated to the second end of the first loop section and the end of the second loop section associated to the end of the first end of the third loop section the said first and third loop sections are electrically connected to the said second loop section by means of electronic units one of which is a tuning unit and the other of which is a detuning unit.

24. A coil according to claim 22, wherein the coil is formed by four loop sections having a first and a second end the first end of the first loop section forming with the facing second end of the fourth loop section the outputs of the coil, while the intermediate second and third loop sections are electrically connected one with the other and respectively to the first and to the fourth loop section by means of an electronic unit, one unit being a tuning unit and the other two units being two detuning units.

25. A coil according to claim 22, wherein the coil is formed by several loop sections each having a first and a second end mechanically separated from the other adjacent loop sections, the first end of the first loop section and the second end of the last loop section forming the outputs of the coil, while the intermediate loop sections are connected to the preceding and to the following one electrically, at least part of the said intermediate loop sections being connected by electronic units forming at least one a tuning unit and at least one a detuning unit.

26. A coil according to claim 22, wherein the main detecting conductors are continuous.

27. A coil according to claim 22, wherein the loop sections are separated one from the other at the re-closing conductors, at an intermediate, particularly at a central zone thereof.

28. A coil according to claim 22, wherein the re-closing conductors are formed partly by one end of one loop section forming a first main detecting conductor and partly by the end of a second loop section forming a second main detecting conductor.

29. A coil according to claim 22, wherein the tuning unit is an active tuning unit, having an active tuning component.

30. A coil according to claim 23, wherein the detuning unit is a passive electronic circuit.

31. A coil according to clam 22, wherein an coil output signal amplifier is provided which is housed within the volume defined by the coil inside an electromagnetic shielded enclosure.

* * * * *